United States Patent [19]
Gries et al.

[11] Patent Number: 6,017,678
[45] Date of Patent: Jan. 25, 2000

[54] PHOTOCURABLE ELASTOMERIC MIXTURE AND RECORDING MATERIAL OBTAINED THEREFROM FOR THE PRODUCTION OF RELIEF PRINTING PLATES

[75] Inventors: Willi-Kurt Gries; Raimund Josef Faust, both of Wiesbaden, Germany

[73] Assignee: Agfa-Gevaert N.V., Mortsel, Belgium

[21] Appl. No.: 08/427,786

[22] Filed: Apr. 25, 1995

Related U.S. Application Data

[63] Continuation of application No. 08/042,350, Apr. 1, 1993, abandoned.

[30] Foreign Application Priority Data

Apr. 4, 1992 [DE] Germany .............................. 42 11 390

[51] Int. Cl.$^7$ ...................................................... G03F 7/033
[52] U.S. Cl. .................................... 430/286.1; 430/281.1; 430/282.1; 430/283.1; 430/288.1; 430/306; 430/910; 522/110; 522/121
[58] Field of Search ..................................... 430/281, 282, 430/286, 288, 910, 306, 281.1, 282.1, 286.1, 288.1, 283.1; 522/121, 110; 525/294

[56] References Cited

U.S. PATENT DOCUMENTS

| | | | |
|---|---|---|---|
| 3,567,798 | 3/1971 | Haefele et al. | 525/314 |
| 3,739,042 | 6/1973 | Chu et al. | 525/294 |
| 4,042,386 | 8/1977 | Okai et al. | 430/281.1 |
| 4,272,608 | 6/1981 | Proskow | 430/288.1 |
| 4,275,142 | 6/1981 | Hosaka et al. | 430/271.1 |
| 4,446,220 | 5/1984 | Proskow | 430/286.1 |
| 4,517,279 | 5/1985 | Worns | 430/286.1 |
| 4,554,240 | 11/1985 | Schulz et al. | 430/285.1 |
| 4,916,045 | 4/1990 | Koch et al. | 430/270.1 |
| 4,952,481 | 8/1990 | Seio et al. | 430/284.1 |
| 5,250,390 | 10/1993 | Gries | 430/283.1 |
| 5,304,458 | 4/1994 | Berrier et al. | 430/281.1 |
| 5,348,844 | 9/1994 | Wagner | 430/286.1 |

FOREIGN PATENT DOCUMENTS

| | | |
|---|---|---|
| 0130828 | 1/1985 | European Pat. Off. . |
| 0183552 | 6/1986 | European Pat. Off. . |
| 0251228 | 1/1988 | European Pat. Off. . |
| 0261910 | 3/1988 | European Pat. Off. . |
| 0273393 | 7/1988 | European Pat. Off. . |
| 0277418 | 8/1988 | European Pat. Off. . |
| 0 513 493 | 11/1992 | European Pat. Off. . |
| 4032238 | 4/1992 | Germany . |
| 53-10648 | 1/1978 | Japan . |
| 63-132234 | 6/1988 | Japan . |
| 63-162712 | 7/1988 | Japan . |
| 64-49035 | 2/1989 | Japan . |
| 5-150451 | 6/1993 | Japan . |
| 80/0506 | 1/1980 | South Africa . |
| 1366769 | 9/1974 | United Kingdom . |
| 2171107 | 8/1986 | United Kingdom . |
| 2179360 | 3/1987 | United Kingdom . |
| WO 88/02135 | 3/1988 | WIPO . |

OTHER PUBLICATIONS

Janča, J., ed *Steric Exclusion Liguid Chromatography of Polymers*, Marcel Dekker, Inc, NY (1984), pp. 56, 57, 66, 67, 70, 71.

Hawley, G. ed *The Condensed Chemical Dictionary*, Ninth Edition, Van Nostrand Reinhold Co, NY. (1977), pp. 46, 47.

Rigaudy, J. et al. ed. *IUPAC Nomenclature of Organic Chemistry*, 1979 Edition, Pergamon Press, NY (1979), p. 249.

Derwent Abstract AN 88–091899 of JP 63–132234 (Pub Jun. 1988).

Chemical Abstracts, vol. 111, No. 4, Jul. 24, 1989, Columbus, OH, Abstract No. 31381q., & JP–A–1 049 036 (Japan Synthetic Rubber Co., Ltd.) Feb. 23, 1989.

G. Sylvester und P. Muller in Houben–Weyl–Muller, Methoden der Organischen Chemie E 20/2, 798ff. (1987).

G. Schroder in Houben–Weyl–Muller, Methoden der Organischen Chemie E20/2, 1141ff. (1987).

S. Tazuke und S. Okamura, Encyclopedia of Polym. Sci. and Technolo., Bd. 14, 637, John Wiley & Sons, New York–London 1971.

*Primary Examiner*—Janis L. Dote
*Attorney, Agent, or Firm*—Foley & Lardner

[57] ABSTRACT

The invention relates to a photocurable, negative-working mixture and a recording material which is obtained therefrom and which is suitable for the production of elastic relief printing plates. The mixture contains a) an amphiphilic elastomeric binder, b) a free-radical-polymerizable compound which is compatible with the binder and which has at least one terminal, ethylenically unsaturated group and a boiling point of over about 100° C. at normal pressure and c) a compound or a combination of compounds which is capable of initiating the polymerization of the compound b) on exposure to actinic light. The binder is made up of the segments A, B, C and X, where:

A) is a hydrophobic soft block having a glass transition temperature $T_g$ of below about −30° C.;

B) is a hydrophilic hard block which contains basic groups and has a glass transition temperature $T_g$ of over about +10° C.;

C) is a hydrophobic hard block having a glass transition temperature $T_g$ of over about +50° C.; and X) is a unit formed from a compound containing two or more vinyl or isopropenyl groups or a homopolymer block which is prepared from such compounds and is branched or crosslinked.

17 Claims, No Drawings

PHOTOCURABLE ELASTOMERIC MIXTURE AND RECORDING MATERIAL OBTAINED THEREFROM FOR THE PRODUCTION OF RELIEF PRINTING PLATES

This is a continuation of application Ser. No. 08/042,350 filed on Apr. 1, 1993, now abandoned.

The invention relates to a photocurable, negative-working mixture and a recording material which is obtained therefrom and which is suitable for the production of elastic relief printing plates.

Photocurable, negative-working mixtures are known and usually contain an elastomeric binder, a free-radical-polymerizable compound and a polymerization initiator which can be activated by actinic radiation. Such mixtures, which are described, for example, in DE-A 22 15 090 (=GB-A 1 366 769), can be developed after exposure to produce the relief image only with organic solvents.

Although DE-A 30 03 011 (=ZA 80/506), DE-A 27 25 730 (=U.S. Pat. No. 4,042,386), DE-A 33 22 994 (=U.S. Pat. No. 4,554,240) and EP-A 0 130 828 describe recording materials developable in aqueous media and based on partially hydrolyzed polyvinyl acetate derivatives, the water resistance of such systems is, however, low, with the result that use with water-dilutable printing inks is impossible. DE-A 30 12 841 (=U.S. Pat. No. 4,272,608), DE-A 35 43 646 (=U.S. Pat. No. 4,916,045), EP-A 0 183 552, 0 251 228, 0 273 393, 0 277 418 and 0 261 910, GB-A 2 179 360, U.S. Pat. Nos. 4,446,220 and 4,517,279 therefore propose recording materials based on diene elastomers containing carboxyl groups. Binders containing amino groups and in accordance with GB-A 2 171 107 and DE-A 36 04 402 (=U.S. Pat. No. 4,952,481), on the other hand, are much less used.

Both the acidic and the basic binders contain the hydrophilic, ionizable groups which are decisive for stripping in more or less random distribution. If the proportion of such hydrophilic units in these systems is low, a developability in aqueous media can only be achieved with difficulty and it is necessary to add a high proportion of polar monomers or auxiliaries, which result, in turn, in a high cold flow of the unexposed material. Although an increase in the proportion of polar groups results in an improved developability in aqueous media, the rubber-elastic properties of these materials, however, deteriorate for system reasons. In addition, the resistance to water-containing printing inks decreases.

DE-A 40 32 238 describes photocurable elastomeric mixtures which contain, as an elastomeric binder, a block copolymer which is made up of the segments A, B, C and X, where:

A) is a hydrophobic soft block having a glass transition temperature $T_g$ of less than $-30°$ C.;

B) is a hydrophilic hard block which contains acidic groups, preferably carboxyl groups and has a glass transition temperature $T_g$ of more than $+30°$ C.;

C) is a hydrophobic hard block having a glass transition temperature $T_g$ of more than $+50°$ C.;

X) is a unit formed from a compound containing two or more vinyl or isopropenyl groups or a homopolymer block which is prepared from such compounds and which is, as a rule, branched or crosslinked.

The object of the invention was to propose photosensitive elastomeric mixtures which can be developed in aqueous media under mild conditions but have a high resistance to water-dilutable printing inks.

Surprisingly, it has now been possible to achieve this object by using amphiphilic basic block copolymers as binders. Here such block copolymers are described as "amphiphilic" block copolymers which have both water-attracting (hydrophilic) and water-repelling (hydrophobic) sections and therefore have a surfactant nature.

The present invention relates to a photocurable elastomeric mixture which contains:

a) an amphiphilic elastomeric binder or a mixture of such binders;

b) a free-radical-polymerizable compound which is compatible with the binder and which has at least one terminal, ethylenically unsaturated group and a boiling point of over about 100° C. at normal pressure; and c) a compound or a combination of compounds which is capable of initiating the polymerization of the compound (b) on exposure to actinic light, where the binder is a block copolymer which is soluble in water or an aqueous solution or dispersible therein and which is made up of the segments A, B, C and X; and A) is a hydrophobic soft block having a glass transition temperature $T_g$ of below about about $-30°$ C.;

B) is a hydrophilic hard block which contains basic groups and has a glass transition temperature $T_g$ of over about $+10°$ C.;

C) is a hydrophobic hard block having a glass transition temperature $T_g$ of over about $+50°$ C.; and X) is a unit formed from a compound containing two or more vinyl or isopropenyl groups or a homopolymer block which is prepared from such compounds and which is branched or crosslinked.

The block copolymers of the present invention can be synthesized in a variety of ways, depending on which and how many of these segments the copolymer contains and how said segments are linked to one another. These block copolymers may, for example, have the following structures: A-B, C-A-B, C-A-C-B, $A_nXB_n$, $(A-B)_nX$, $C_nX(A-B)_n$, $(C-A)_nXB_n$, $(C-A-B)_nX$, $C_nX(A-C-B)_n$, $(C-A)_nX(C-B)_n$, $(C-A-C)_nXB_n$ and $(C-A-C-B)_nX$. Furthermore, symmetrical B-A-B and B-C-A-C-B block copolymers and branched representatives corresponding to $X(B-A-B)_nX$, $B_nXA_nXB_n$, $X(B-C-A-C-B)_nX$, $(B-C)_nXA_nX(C-B)_n$ and $B_nX(C-A-C)_nXB_n$ may be used as binders.

In these formulae, the symbols A, B, C and X have the meanings specified above and n specifies the ratio of A or B or C homopolymer blocks to the crosslinked homopolymer block X.

Suitable monomers for the block polymers A are conjugated dienes, such as 1,3-butadiene, isoprene, 2,3-dimethyl-1,3-butadiene, 1,3-pentadiene, 2-methyl-3-ethyl-1,3-butadiene, 3-methyl-1,3-pentadiene, 2-methyl-3-ethyl-1,3-pentadiene, 2-ethyl-1,3-pentadiene, 1,3-hexadiene, 2-methyl-1,3-hexadiene, 1,3-heptadiene, 1,3-octadiene, 3,4-dimethyl-1,3-hexadiene and 2-phenyl-1,3-butadiene. The use of mixtures of suitable dienes or the use of other anionically polymerizable conjugated dienes containing from about 4 to 12 carbon atoms is also possible. Preferably, isoprene and 1,3-butadiene are used.

The blocks B result from ethylenically $\alpha,\beta$-unsaturated compounds such as the amino-functionalized acrylates and vinylaromatics substituted with amino groups. In this compounds, the amino groups are present as tertiary amino groups. Primary or secondary amino groups may advantageously be blocked by protective groups, for example by alkylsilyl groups, so that the anionically initiated polymerization process can proceed without chain termination. Dimethylaminoalkyl methacrylates are preferably used. The basic groups in the blocks B are thus preferably amino, alkylamino or dialkylamino groups.

Suitable monomers for the segments C are vinylaromatics, in particular styrene, alkylstyrene or vinylnaphthalene, styrene being particularly preferred.

Suitable crosslinkers X are monomers containing at least two vinyl or isopropenyl groups. Here di- and trivinylbenzene, and also compounds containing at least two methacryloyloxy groups are advantageously used. Particularly preferred are 1,4-divinylbenzene, 1,3-diisopropenylbenzene, ethylene glycol dimethacrylate and trimethylolpropane trimethacrylate.

The block polymers described are prepared by methods known per se. Here reference may be made to G. Sylvester and P. Müller in Houben-Weyl-Müller, *Methoden der Organischen Chemie* E 20/2, 798 et seq. (1987), G. Schröder in Houben-Weyl-Müller, *Methoden der Organischen Chemie* E 20/2, 1141 et seq. (1987) and S. Tazuke and S. Okamura, *Encyclopedia of Polym. Sci. and Technol., Vol.* 14, 637, John Wiley & Sons, New York-London-Toronto 1971 and A. Nazarov et al., Deposited Doc., VINITI 2486–74 (1974).

The standard organolithium compounds R—Li are used to initiate the anionic polymerization, R being understood as meaning aliphatic, cycloaliphatic, aromatic or mixed aliphatic/aromatic radicals. Particularly worthy of mention are, inter alia, methyllithium, ethyllithium, (n-, sec-, tert-) butyllithium, isopropyllithium, cyclohexyllithium, phenyllithium and p-tolyllithium. In addition, bifunctional initiators which are active in nonpolar media, such as those which result from free-radical coupling of diphenylethene by means of Li metal or are formed by reaction of diisopropenylbenzenes with organo-Li compounds. Preferably, sec- or n-BuLi, and also 1,4-dilithio-1,1,4,4-tetraphenylbutane are used.

The copolymerization is carried out under the standard conditions for handling extremely moisture- and oxygen-sensitive reagents, ie. in particular that a dry inert gas atmosphere, for example a nitrogen or argon atmosphere, has to be employed. The solvents used are aliphatic, cycloaliphatic and aromatic hydrocarbons such as isobutane, n-pentane, isooctane, cyclopentane, cyclohexane, cycloheptane, benzene, toluene or xylene, and also mixtures of these solvents. It is frequently expedient to work in the presence of dipolar aprotic solvents in order to ensure a regioselective reaction of the monomers and thus minimize the proportion of side-reaction products. (A reaction is described as "regios-elective" if, of two or more centers of a molecule capable of reaction, one reacts largely predominantly or exclusively.) Particularly preferred dipolar aprotic solvents are ethers such as, for example, tetrahydrofuran, dimethoxyethane or methyl phenyl ether. To obtain particular product properties, it proves beneficial to start the anionic copolymerization in nonpolar, aprotic solvents but, as the conversion proceeds, to increase the polarity of the solvent by adding more strongly polar ethers. In this connection, the proportion by volume of the ethers may be up to over about 95% of the total solvent volume.

The anionic chain ends of the A and C blocks frequently have too strong a nucleophilic nature. Before the further copolymerization, a reduction in the nucleophilic nature of the anionic chain end is therefore expedient. This can be achieved by adding unsaturated compounds of the formula $CH_2=CR^1R^2$. Here $R^1$ and $R^2$ are aryl or alkylaryl groups, in particular, however, optionally substituted phenyl groups. Nevertheless, l-phenyl-1-naphthylethene and its derivatives can also be used. Styrenes ($R^1$=optionally substituted phenyl, $R^2$=H or $C_1$–$C_6$-alkyl) are also suitable, in particular if styrene block polymers are to be introduced. However, 1,1-diphenylethene is preferred.

The block copolymerization is carried out in a known manner by sequential addition of the various monomers. In this connection, the reaction is conducted in such a way that the vinyl compounds necessary to synthesize the successive blocks are added only after substantial reaction of the monomers already present. The reaction temperature is set at between about –80° C. and 120° C. Preferably, the temperatures vary between about –72° C. and 60° C. It is advisable to polymerize the monomers used to synthesize the B blocks at least at room temperature, but preferably at about –72° C. After completion of the desired block synthesis, the polymeric anions may be deactivated by proton sources such as alcohols, water, ammonium chloride or HCl.

The molecular weights determined by gel permeation chromatography (GPC) vary between about 2,000 g/mol and 2,000,000 g/mol, preferably between about 15,000 g/mol and 200,000 g/mol. The proportions by mass of the block components involved, based on the total weight of the block copolymer, vary from about 20 to 99% by weight for A, from about 1 to 30% by weight for B, from about 0 to 79% by weight for C and from 0 to about 5% by weight, preferably up to about 3% by weight, for X.

The photosensitive mixtures according to the invention generally contain from about 20 to 95% by weight, preferably from about 30 to 90% by weight, of the amphiphilic binder either exclusively or in combination with other polymeric materials with or without functional groups. Such polymeric materials may be chlorinated or chlorosulfonated polyethylene compounds, randomly structured or segmented diene polymers or copolymers, and also suitable thermoplastic elastomers which can be prepared by polyaddition or polycondensation. They further contain at least one free-radical-polymerizable, olefinically unsaturated compound and also at least one photoinitiator.

Suitable monomers containing one or more polymerizable olefinic double bonds are, in particular, esters and amides of acrylic, methacrylic, fumaric and maleic acid with a monohydric or polyhydric alcohol or amine, and also mixtures of these compounds. In addition, the alcohols or amines needed to form the esters or amides may contain further functionalities, for example ether units, hydroxyl, or primary, secondary or tertiary amino groups. Examples of alcohols suitable for ester formation are open-chain and cyclic alcohols such as butanol, hexanol, octanol, decanol, dodecanol, octadecanol, 2-ethylhexanol, cyclohexanol or borneol, and also oligo- or polybutadienes containing hydroxyl groups and oligo- or polyisoprenes containing hydroxyl groups. Other suitable alcohols are alkanediols, polyfunctional alcohols and similar compounds, for example 1,4-butanediol or 1,6-hexanediol, (poly)ethylene glycol or (poly)propylene glycol, glycerol, trimethylolpropane, butanetriol, pentaerythritol etc. In this connection, the di- or polyfunctional alcohols may be partially or completely esterified. Other examples of unsaturated compounds are specific esters and amides of (meth)acrylic acid, for example dimethylaminoethyl (meth)acrylate, dimethylaminopropyl (meth)acrylamide, monomethacryloyloxyethyl maleate (HEMAM), bis-2-methacryloyloxyethyl pyromellitate (HEMAP), 2-butylaminoethyl (meth)acrylate, ethylenebis (meth)acrylamide, hexamethylenebis(meth)acrylamide, diethylenetriaminetris(meth)acrylamide, hydroxymethyl (meth)acrylamide and bishydroxyethyl(meth)acrylamide.

The amount of monomers is generally about 5 to 70% by weight, preferably about 10 to 50% by weight, of the nonvolatile constituents of the mixture.

Suitable photoinitiators for the mixtures according to the invention are those known compounds which have an adequate thermal stability in the processing of the recording materials and also an adequate free-radical formation during exposure to initiate the polymerization of the monomers. They should absorb light in the wavelength range from approximately 250 nm to 500 nm to form free radicals. Examples of suitable photoinitiators are acyloins and their derivatives such as benzoin, benzoin alkyl ether, 1,2-diketones and their derivatives, for example benzil, benzil acetals such as benzil dimethyl ketal, fluorenones, thioxanthones, polynuclear quinones, acridines and quinoxalines, and also trichloromethyl-s-triazines, 2-halomethyl-4-vinyl-1,3,4-oxadiazole, halooxazoles substituted with trichloromethyl groups, carbonylmethylene heterocycles containing trihalomethyl groups, acylphosphine oxide compounds and other phosphorus-containing photoinitiators, for example the 6-acyl-6H-dibenzo[c,e][1,2]oxaphosphorin 6-oxides, in particular 6-(2,4,6-trimethylbenzoyl)-6H-dibenzo[c,e]-[1,2]oxaphosphorin 6-oxide. The photoinitiators can also be used in combination with one another or with coinitiators or activators, for example with Michler's ketone and its derivatives or 2-alkylanthraquinones. The amount of photoinitiator is generally about 0.01 to 10% by weight, preferably about 0.5 to 5% by weight, of the recording material.

It is often advantageous to add still other auxiliary materials and additives to the recording material, for example those which inhibit thermal polymerization, such as hydroquinone and its derivatives, 2,6-di-tert-butyl-p-cresol, nitrophenols, nitrosamines such as N-nitrosodiphenylamine or salts of N-nitrosocyclohexylhydroxylamine, for example its alkali-metal or aluminum salts. Other standard additives are dyes, pigments, processing aids and plasticizers.

The mixtures according to the invention can be processed to form layers having a thickness of 0.02 to 6 mm, preferably of 0.2 to 3 mm, by casting from solution or extrusion and calendering in order to produce relief printing plates and flexographic printing plates. The layer can be laminated onto the surface of a suitable substrate or a solution of the mixtures according to the invention can be applied directly to a layer substrate.

The mixtures according to the invention may be used not only to produce relief printing plates but also, for example, to produce planographic printing plates, gravure cylinders, screen printing stencils and photoresists.

According to the application purpose, suitable substrates are, for example, polyester sheets, steel or aluminum sheets, copper cylinders, screen printing stencil substrates, foam layers, rubber-elastic substrates or printed circuit boards. It may also be advantageous to apply a covering or protective layer, for example a thin layer of polyvinyl alcohol or polyamide, or a peelable covering sheet, for example composed of polyethylene terephthalate, to the photosensitive recording layer. Furthermore, a precoating of the substrate may be advantageous. The additional layer between the substrate and the photosensitive layer may act, for example as a haloprotection layer or an adhesion layer.

The recording materials according to the invention may be imagewise exposed with actinic light from light sources such as mercury vapor lamps or fluorescent tubes, the emitted wavelength preferably being between 300 and 420 nm. The unexposed and uncrosslinked layer portions can be removed by spraying, washing or brushing with water, or basic or acidic aqueous solutions. Suitable basic materials are, for example, hydroxides, carbonates or hydrogencarbonates of the alkali metals, ammonia and organic amines, and suitable acidic materials are monobasic or polybasic, water-soluble organic acids. Furthermore, wetting and emulsifying agents, and also organic solvents which can be mixed with water, for example aliphatic alcohols, ethylene glycols and ethylene glycol monoethers may be added. The proportion of the basic or acidic components in the solution is generally from about 0.01 to 5% by weight, preferably from about 0.1 to 1% by weight. At the same time, the proportion of organic solvent is less than about 40% by weight, preferably less than about 20% by weight.

Alternatively, organic solvents such as aromatic hydrocarbons, chloroalkanes and ketones may be used as developers. Examples of these are toluene, xylene, 1,1,1-trichloroethane, tetrachloroethylene, methyl isobutyl ketone etc. which may, however, also be used in combination with lower alcohols, for example n-butanol. Expediently, the developed relief forms are dried at temperatures of up to about 120° C. and optionally post-treated photochemically or chemically.

The recording materials according to the invention are suitable in particular for producing printing forms, especially for flexographic or planographic printing.

The invention is illustrated by the examples below. Unless otherwise specified, % data are % by weight data.

PREPARATION OF THE BLOCK COPOLYMERS

Preparation Example 1

300 ml of anhydrous toluene are placed in a dry, repeatedly evacuated glass apparatus ventilated with pre-dried nitrogen, 139 mmol of dry styrene are added, followed by 2.30 ml of a 1.6 M n-butyllithium solution in hexane. The polymerization starts after a short time. The reaction mixture is stirred for 1 hour in a water bath at room temperature. 1.50 mol of isoprene are added to the orange-colored reaction mixture. After stirring for 3 hours in the water bath, 2 equivalents, based on the polymerization initiator, of 1,1-diphenylethene are added, dilution is carried out with 300 ml of tetrahydrofuran (THF), and the reaction mixture is stirred for 15 minutes at room temperature and then cooled to −72° C. 186 mmol of N,N-dimethylaminoethyl methacrylate are added to the dark-red, viscous reaction mixture, the reaction mixture is stirred at −72° C. for 1 hour and thawed after adding 2 ml of methanol and 1 mol % of 2,6-di-tert-butyl-4-methylphenol. The reaction solution is then sprayed into 10 times the volume of methanol. The polymer precipitated is filtered off by suction, washed and dried.

1 S-I-DMAEMA (10/70/20%), yield=87%, GPC (THF): Mp (RI)=46000, D=1.20

Preparation Examples 2 and 3

Examples 2 and 3 are prepared analogously, but after completion of the isoprene polymerization, the second styrene block is introduced in the course of one hour by adding an appropriate amount of styrene at room temperature.

2 S-I-S-DMAEMA (8/74/8/10%), yield=81%, GPC (THF): Mp (RI)=129000, D=1.13

3 S-I-S-DMAEMA (8/64/8/20%), yield=95%, GPC (THF): Mp (RI)=41000, D=1.02

Preparation Example 4

A comparable block copolymer with 4-vinylpyridine as the basic component was prepared along the lines of Examples 2 and 3. In this case, instead of toluene, cyclohexane was used as solvent. The steric blocking of the reactive chain end with 1,1-diphenylethene before adding the basic component was not necessary. The actual polymerization was carried out at room temperature over a period of 19 hours, but before the 4-vinylpyridine was added and during the first reaction hour, cooling was carried out with an ice/water bath.

4 S-I-S-4VP (8/64/8/20%), yield=93%, GPC (THF): Mp (RI)=70000, D=1.22.

The abbreviations used in the above examples, if not generally in use, have the following meaning:

S=styrene
I=isoprene
DMAEMA=dimethylaminoethyl methacrylate
MAA=methacrylic acid
4VP=4-vinylpyridine The GPC investigations were carried out in tetrahydrofuran with polystyrene standards as a reference molecular weight.

EXAMPLE 1

(Flexographic Printing Plate)

19.2 g of the S-I-DMAEMA block copolymer synthesized in accordance with Preparation Example 1 and containing a proportion of 10% styrene, 70% isoprene and 20% N,N-dimethylaminoethyl methacrylate, 2.85 g of polyisoprene (Kuraray: LIR 403),
1.50 g of mono-2-acryloyloxyethyl maleate,
3.00 g of tripropylene glycol diacrylate,
0.30 g of benzil dimethyl ketal,
0.15 g of 2,6-di-tert-butyl-4-methylphenol and
3.00 g of medical white oil (Shell: ONDINA OIL G 33) are homogenized in a kneader (Brabender Plasticorder) at 80 rev/min and a temperature of 120° C. The resultant clear material is then pressed in a platen press to a total layer thickness of 3 mm at 120° C. and 15 bar for 1.5 min and 35 bar for 2 min between two 0.125 mm thick, polyester films one of which being provided with an adhesion layer and the other with a water-soluble anti-tack layer. After rear-side exposure for 20 seconds, imagewise exposure is carried out for 8 min in a UV-A flat-bed exposure apparatus, followed by stripping at 60° C. in the course of 8 min using a flat-brush development apparatus. In this process, a 1%-strength sodium hydroxide solution, to which 5% of Na dodecylbenzenesulfonate have been added, is used as developer.

The post-exposed printing plate has a Shore A hardness of 35 (30 s) and yields a swelling value of 2.27%, 4.79% and 14.5% in water, in ethanol or in a mixture of 85 parts of ethanol and 15 parts of ethyl acetate, respectively.

The flexographic printing plates of Examples 2 to 10 are produced in the same way. The composition of the coating materials and the properties of these printing plates are shown in Tables I and II. It was attempted to strip the printing plates in accordance with Examples 1 to 10 with various liquids in accordance with Table III. The cases in which stripping occurs are denoted by +, the cases in which no stripping occurs are denoted by −, while o stands for a partial stripping.

TABLE I

| Composition | Examples | | | | | | | | |
|---|---|---|---|---|---|---|---|---|---|
| | 2 | 3 | 4 | 5 | 6 | 7 | 8 | 9 | 10 |
| Binder 1 | 13.2 | — | — | — | — | — | — | — | — |
| Binder 2 | — | 19.2 | 19.2 | 13.3 | 13.2 | — | — | — | — |
| Binder 3 | — | — | — | — | — | 22.2 | 22.2 | 11.1 | — |
| Binder 4 | — | — | — | — | — | — | — | — | 20.4 |
| Block copolymer composed of S-I-S-MAA 8/64/8/20 | 6.0 | — | — | 6.0 | 6.0 | — | — | 11.1 | — |
| Benzil dimethyl ketal | 0.3 | 0.3 | 0.3 | 0.3 | 0.3 | 0.3 | 0.3 | 0.3 | 0.3 |
| 2,6-di-tert-butyl-4-methylphenol | 0.15 | 0.15 | 0.15 | 0.15 | 0.15 | 0.15 | 0.15 | 0.15 | 0.15 |
| Liquid polyisoprene containing COOH | 2.85 | 2.85 | 2.85 | 2.85 | 2.85 | 2.85 | 2.85 | 2.85 | 2.85 |
| Tripropylene glycol diacrylate | 3.0 | 3.0 | 3.0 | 3.0 | 3.0 | 3.0 | 3.0 | 3.0 | 3.0 |
| Dimethylaminoethyl methacrylate | — | — | — | — | — | 1.5 | — | 1.5 | — |
| Dimethylaminopropyl-methacrylamide | — | — | 1.5 | — | 1.5 | — | — | — | — |
| Mono-2-acryloyloxy-ethyl maleate | 1.5 | 1.5 | — | 1.5 | — | — | 1.5 | — | 1.5 |
| Medical white oil | 3.0 | 3.0 | 3.0 | 3.0 | 3.0 | — | — | — | 1.8 |

TABLE II

| Properties | Examples | | | | | | | | |
|---|---|---|---|---|---|---|---|---|---|
| | 2 | 3 | 4 | 5 | 6 | 7 | 8 | 9 | 10 |
| Hardness (Shore A/30 s) | 2 | 37 | 34 | 5 | 37 | 19 | 34 | 37 | 27 |
| Swelling (%) | | | | | | | | | |
| H$_2$O | 2.94 | 0.73 | 0.68 | 1.88 | 1.28 | 1.51 | 1.75 | 2.88 | 1.37 |
| EtOH | 17.7 | 0.72 | 1.06 | 7.26 | 1.11 | 16.6 | 5.10 | 4.12 | 4.63 |
| EtOH/EtOAc (85/15) | 67.6 | 4.62 | 6.02 | 20.6 | 6.51 | 27.7 | 14.5 | 10.7 | 12.1 |

TABLE III

| Stripping | 1 | 2 | 3 | 4 | 5 | 6 | 7 | 8 | 9 | 10 |
|---|---|---|---|---|---|---|---|---|---|---|
| organic solvent (toluene) | + | + | + | + | + | + | + | + | + | + |
| Water | – | – | – | – | – | – | – | – | – | – |
| Na dodecyl-benzenesulfonate | + | + | – | – | – | – | + | + | + | – |
| Na dodecyl sulfate | – | – | – | – | – | + | + | + | – | |
| Na salt of oleic acid sarcoside (61%-strength paste) all 5%-strength in 1%-strength NaOH | + | + | – | – | – | – | o | + | + | – |
| Na dodecylbenzene-sulfonate | – | o | – | – | – | – | – | + | n.b | – |
| Na dodecyl sulfate | – | – | – | – | – | – | – | – | n.b | – |
| Na salt of oleic acid sarcoside (61%-strength paste) in each case 5%-strength in water | – | o | – | – | – | – | + | – | n.b | – |
| 1%-strength acetic acid | – | o | – | – | – | – | – | – | n.b | + |

+ Stripping
– no stripping
o partial stripping
n.b not determined

EXAMPLE 11

(Offset Printing Plate)

A coating solution composed of 6.59 g of the S-I-S-DMAEMA block copolymer synthesized in accordance with Preparation Example 2 and containing a proportion of 16% styrene, 74% isoprene and 10% N,N-dimethylaminoethyl methacrylate, 6.59 g of trimethylolpropane triacrylate, 0.12 g of phenylacridine, 0.14 g of SAMARON NAVY BLUE HR (Disperse Blue 290), 0.12 g of dibenzalacetone and 86.4 g of tetrahydrofuran was applied to a 0.3 mm thick aluminum substrate which had been grained in nitric acid, anodized in sulfuric acid and post-treated with a 0.1%-strength aqueous solution of polyvinylphosphonic acid. The layer weight was 5.5 g/m². The plate was then coated with a 3.5%-strength aqueous solution of a polyalkylene oxide/polyvinyl alcohol graft polymer (Hoechst: $^{(R)}$MOWIOL 04/M1) (layer weight after drying 0.8 g/m²). The printing plate obtained was exposed using a 5 kW metal halide lamp for 40 seconds at a distance of 110 cm under an exposure wedge and also various other test elements comprising microlines and small dot patches. After exposure, the plate was treated with a developer (5%-strength Na salt of oleic acid sarcoside in a 1%-strength sodium carbonate solution) using a plush tampon.

The unexposed layer regions were cleanly removed within a few seconds, a copy having a very high resolution and good ink absorption being obtained.

We claim:

1. A photocurable mixture which comprises:

a) an elastomeric binder or binder mixture;

b) a free-radical-polymerizable compound which is compatible with the binder and which has at least one terminal, ethylenically unsaturated group and a boiling point of over 100° C. at normal pressure; and c) a compound or a combination of compounds which is capable of initiating the polymerization of the compound (b) on exposure to actinic light;

wherein the elastomeric binder a) is a block copolymer which is soluble in water or an aqueous solution or dispersible therein and has a structure selected from the group consisting of A-B, C-A-B, C-A-C-B, $A_nXB_n$, $(A-B)_nX$, $C_nX(A-B)_n$, $(C-A)_nXB_n$, $(C-A-B)_nX$, $C_nX(A-C-B)_n$, $(C-A)_nX(C-B)_n$, $(C-A-C)_nXB_n$, $(C-A-C-B)_nX$, B-C-A-C-B, $X(B-A-B)_nX$, $B_nXA_nXB_n$, $X(B-C-A-C-B)_nX$, $(B-C)_nXA_nX(C-B)_n$ and $B_nX(C-A-C)_nXB_n$, in which A) is a hydrophobic soft block having a glass transition temperature of below –30° C.;

B) is a hydrophilic hard block which contains amino, alkylamino or dialkylamino groups as basic groups and has a glass transition temperature of over +10° C., wherein said hydrophilic hard block B) is present in an amount of from 20 to 30 wt %, based on the total weight of the block copolymer;

C) is a hydrophobic hard block having a glass transition temperature of over +50° C.;

X) is a unit formed from a compound containing two or more vinyl or isopropenyl groups, or a homopolymer block which is prepared from such compounds and is branched or crosslinked, and n) is the ratio of A, B or C homopolymer blocks to the crosslinked homopolymer block X, wherein a photocurable recording material produced from the mixture is developable with water or with basic or acidic aqueous solution following imagewise exposure of the recording material.

2. A photocurable elastomeric mixture as claimed in claim 1, wherein the elastomeric block copolymer which serves as the binder comprises of 20 to 99% by weight of the polymer blocks A, of 20 to 30% by weight of the polymer blocks B, of 0 to 79% by weight of the polymer blocks C and of 0 to 5% by weight of the block X, all based on the total weight of the block copolymer.

3. A photocurable, elastomeric mixture as claimed in claim 2, wherein the elastomeric block copolymer comprises from 0 to 3% by weight of the block X, based on the total weight of the block copolymer.

4. A photocurable elastomeric mixture as claimed in claim 1, wherein, in the elastomeric block copolymer serving as the binder, the soft polymer blocks A are formed from conjugated dienes, and the hard polymer blocks C from vinyl-aromatics.

5. A photocurable elastomeric mixture as claimed in claim 4, wherein the conjugated diene is 1,3-butadiene, isoprene or 2,3-dimethyl-1,3-butadiene.

6. A photocurable, elastomeric mixture as claimed in claim 4, wherein the hydrophilic hard block comprises dimethylaminoalkyl methacrylate.

7. A photocurable elastomeric mixture as claimed in claim 4, wherein the vinylaromatic is styrene or vinylnaphthalene.

8. A photocurable elastomeric mixture as claimed in claim 1, wherein the segment X is synthesized from 1,4-divinylbenzene, 1,3-diisopropenylbenzene, ethylene glycol dimethacrylate or trimethylolpropane trimethacrylate.

9. A photocurable elastomeric mixture as claimed in claim 1, wherein the block copolymer serving as the binder has a molecular weight $M_p$ of between 15,000 and 200,000 g/mol.

10. A photocurable elastomeric mixture as claimed in claim 1, wherein the free-radical-polymerizable compound is an ester or amide of acrylic, methacrylic, fumaric or maleic acid with a monohydric or polyhydric alcohol or amine.

11. A photocurable elastomeric mixture as claimed in claim 1, which is comprised of 20 to 95% by weight of elastomeric block copolymer, of 5 to 70% by weight of polymerizable compounds and of 0.01 to 10% by weight of photopolymerization initiator, all based on the total weight of the polymerizable mixture.

12. A photocurable recording material comprising a layer substrate and a photocurable layer, wherein the photocurable layer comprises a mixture as claimed in claim 1.

13. A photocurable recording material as claimed in claim 12, wherein the photocurable layer is developable by aqueous solvents following imagewise exposure of the recording material.

14. A photocurable recording material as claimed in claim 12, wherein the photocurable layer is developable with water or with basic or acidic aqueous solutions following imagewise exposure of the recording material.

15. A photocurable elastomeric mixture as claimed in claim 1, wherein, in the elastomeric block copolymer serving as the binder, the block A is formed from mixtures of conjugated dienes, or from anionically polymerizable conjugated dienes containing from 4 to 12 carbon atoms.

16. A photocurable elastomeric mixture as claimed 1, wherein, in the elastomeric block copolymer serving as the binder, the segment X is formed from di- or trivinylbenzene, or compounds containing at least two methacryloyloxy groups.

17. A photocurable, elastomeric mixture as claimed in claim 1, wherein the elastomeric binder is S-I-DMAEMA, or S-I-S-DMAEMA.

* * * * *